(12) United States Patent
Whetsel et al.

(10) Patent No.: US 11,644,503 B2
(45) Date of Patent: May 9, 2023

(54) TSV TESTING USING TEST CIRCUITS AND GROUNDING MEANS

(71) Applicant: TEXAS INSTRUMENTS INCORPORATED, Dallas, TX (US)

(72) Inventors: Lee D. Whetsel, Parker, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/848,383

(22) Filed: Jun. 23, 2022

(65) Prior Publication Data
US 2022/0317182 A1  Oct. 6, 2022

Related U.S. Application Data

(62) Division of application No. 17/124,062, filed on Dec. 16, 2020, now Pat. No. 11,467,210, which is a division of application No. 16/795,842, filed on Feb. 20, 2020, now Pat. No. 10,901,034, which is a division of application No. 16/293,896, filed on Mar. 6, 2019, now Pat. No. 10,605,866, which is a division of application No. 15/845,339, filed on Dec. 18, 2017, now Pat. No. 10,267,856, which is a division of application No. 15/176,874, filed on Jun. 8, 2016, (Continued)

(51) Int. Cl.
*G01R 31/3177* (2006.01)
*G01R 31/26* (2020.01)
*G01R 31/3185* (2006.01)
*G01R 31/317* (2006.01)

(52) U.S. Cl.
CPC ......... *G01R 31/3177* (2013.01); *G01R 31/26* (2013.01); *G01R 31/31723* (2013.01); *G01R 31/318505* (2013.01); *G01R 31/318577* (2013.01)

(58) Field of Classification Search
CPC ............... G01R 31/3177; G01R 31/26; G01R 31/31723; G01R 31/318505; G01R 31/318577
See application file for complete search history.

(56) References Cited

U.S. PATENT DOCUMENTS 5,498,972 A  3/1996  Haulin
6,617,869 B1  9/2003  Pillkahn
(Continued)

FOREIGN PATENT DOCUMENTS

KR  20110046894 A  5/2011

OTHER PUBLICATIONS

Noia et al., "Pre-bond probing of TSVs in 3D stacked ICs" (Year: 2011).*

*Primary Examiner* — Feba Pothen
(74) *Attorney, Agent, or Firm* — Carl G. Peterson; Frank D. Cimino

(57) ABSTRACT

This disclosure describes a novel method and apparatus for testing TSVs within a semiconductor device. According to embodiments illustrated and described in the disclosure, a TSV may be tested by stimulating and measuring a response from a first end of a TSV while the second end of the TSV held at ground potential. Multiple TSVs within the semiconductor device may be tested in parallel to reduce the TSV testing time according to the disclosure.

20 Claims, 15 Drawing Sheets

Related U.S. Application Data now Pat. No. 9,880,222, which is a division of application No. 13/785,284, filed on Mar. 5, 2013, now Pat. No. 9,383,403.

(60) Provisional application No. 61/670,793, filed on Jul. 12, 2012, provisional application No. 61/613,235, filed on Mar. 20, 2012.

(56) References Cited

U.S. PATENT DOCUMENTS

| | | | |
|---|---|---|---|
| 7,525,305 B2 | 4/2009 | Whetsei | |
| 8,368,422 B1 | 2/2013 | Dale et al. | |
| 2002/0172159 A1 | 11/2002 | Koenig | |
| 2009/0271674 A1 | 10/2009 | Whetsei | |
| 2011/0080184 A1 | 4/2011 | Wu | |
| 2011/0080185 A1 | 4/2011 | Wu | |
| 2011/0102006 A1 | 5/2011 | Choi | |
| 2011/0249483 A1 | 10/2011 | Oh | |
| 2011/0309359 A1 | 12/2011 | Saen et al. | |
| 2012/0025846 A1* | 2/2012 | Minas | G01R 31/2853 324/606 |
| 2012/0092062 A1* | 4/2012 | Lee | H01L 25/0657 327/525 |
| 2012/0242367 A1 | 9/2012 | Goel | |
| 2012/0306038 A1 | 12/2012 | Chow | |
| 2013/0002272 A1 | 1/2013 | Badaroglu | |
| 2013/0006557 A1 | 1/2013 | Chakrabarty | |
| 2013/0093454 A1* | 4/2013 | Lai | G01R 31/318513 324/762.01 |
| 2013/0230932 A1 | 9/2013 | Bringivijayaraghavan | |

* cited by examiner

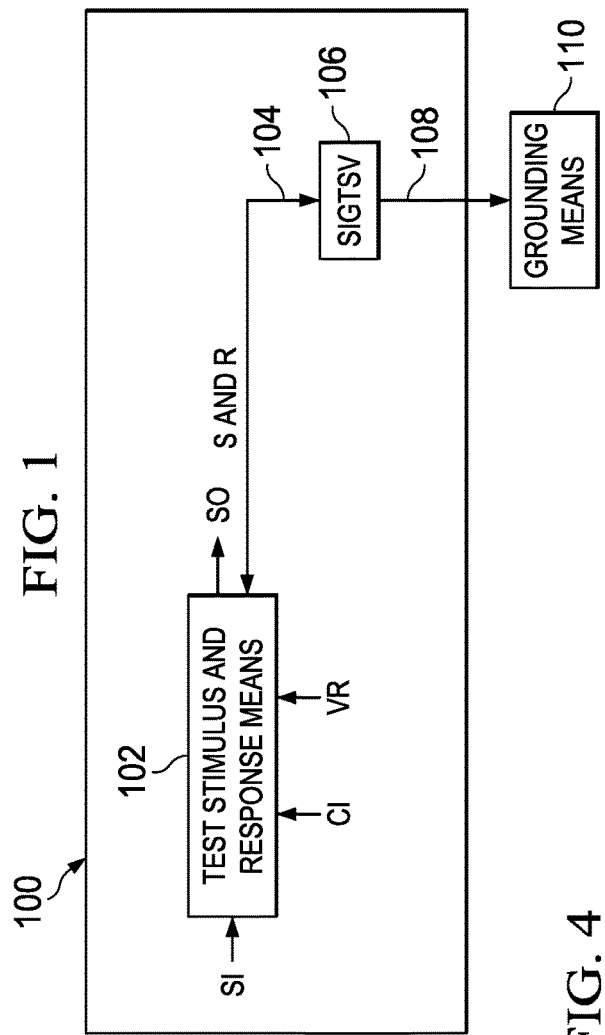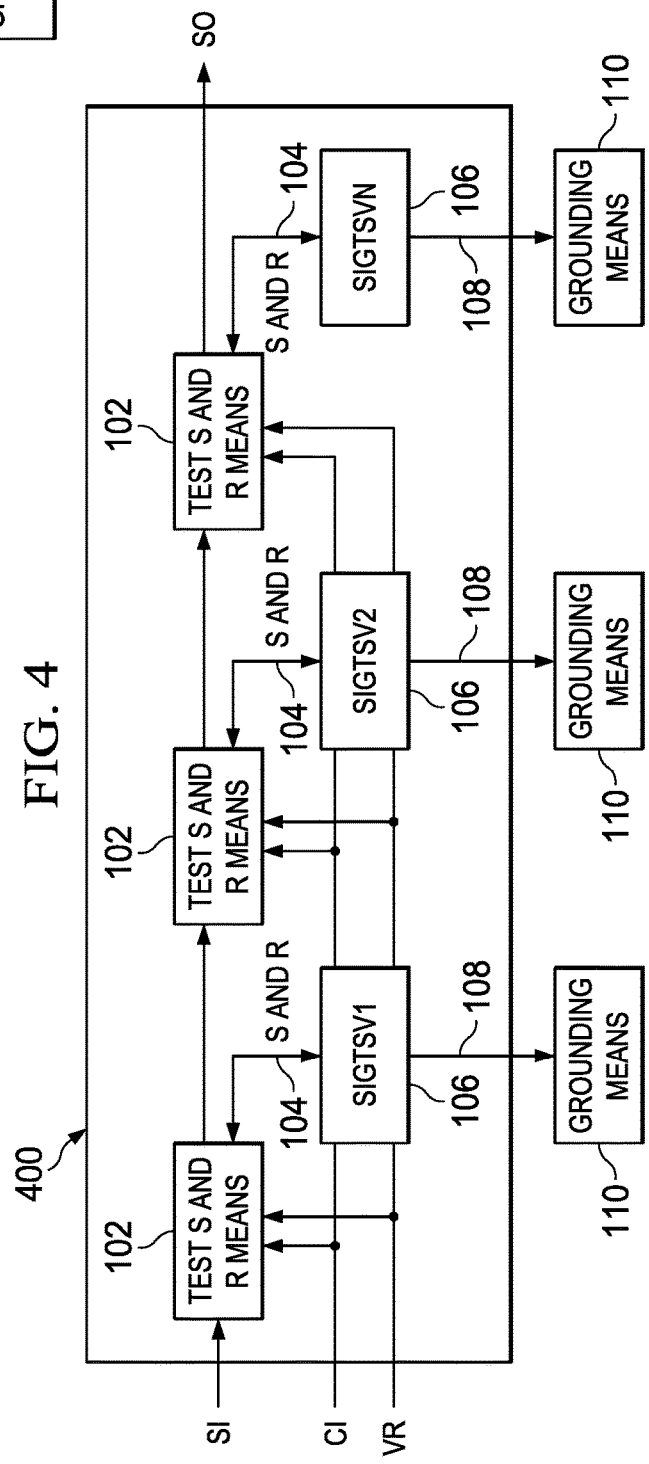

TSV TESTING USING TEST CIRCUITS AND GROUNDING MEANS

RELATED APPLICATIONS

This application is a divisional of prior application Ser. No. 17/124,062, filed Dec. 16, 2020, currently pending;

Which was a divisional of prior application Ser. No. 16/795,842, filed Feb. 20, 2020, now U.S. Pat. No. 10,901,034, issued Jan. 26, 2021;

Which was a divisional of prior application Ser. No. 16/293,896, filed Mar. 6, 2019, now U.S. Pat. No. 10,605,866, issued Mar. 31, 2020;

Which was a divisional of prior application Ser. No. 15/845,339, filed Dec. 18, 2017, now U.S. Pat. No. 10,267,856, issued Apr. 23, 2019;

Which was a divisional of prior application Ser. No. 15/176,874, filed Jun. 8, 2016, now U.S. Pat. No. 9,880,222, issued Jan. 30, 2018;

Which was a divisional of prior application Ser. No. 13/785,284, filed Mar. 5, 2013, now U.S. Pat. No. 9,383,403, issued Jul. 16, 2016;

Which claims priority from Provisional Application No. 61/670,793, filed Jul. 12, 2012;

And also claims priority from Provisional Application No. 61/613,235, filed Mar. 20, 2012.

References made to U.S. Publication 2011/0102006 by Hynix Semiconductor.

FIELD OF THE DISCLOSURE

The embodiments of this disclosure generally relate to testing of an integrated circuit semiconductor device and in particular to the testing of through silicon vias (TSVs) within the semiconductor device.

BACKGROUND OF THE DISCLOSURE

TSVs are signaling paths formed between a contact point on a first surface of the device and a contact point on a second surface of the device. Typically, but not always, the TSV signaling path will include or be coupled to circuitry within the device. TSVs are invaluable in the development and production of 3D stack die assemblies where signals pass vertically up and down the die in the stack. There can be thousands of TSVs in a die providing a large number of up and down signaling path ways in a 3D stack die assembly. TSVs may be used to pass uni-directional signals or bi-directional signals. Each of these thousands of TSV path ways must be tested to ensure the TSVs are capable of transferring signals at required electrical specifications. This disclosure describes a novel method and apparatus for testing signal TSVs in a die using a test circuit means for stimulating and analyzing one end of the TSV while the other end of the TSV is held at a known voltage potential, which, in this disclosure, is shown to be a ground voltage potential.

BRIEF SUMMARY OF THE INVENTION

Various aspects of the disclosure include a TSV test circuit means and a method for testing a TSV within a device using the test circuit means to determine if the TSV meets the signaling requirements of the device.

In a first aspect of the disclosure, the TSV test circuit means includes a current source means to apply a known current to a first end of the TSV while the second end of the TSV is held at a ground potential, a comparator circuit means for detecting the voltage level developed at the first end of the TSV in response to the applied current, a scan cell means for loading and shifting out a logic level indicative of the voltage level detected by the comparator circuit means and for controlling the current source means to one of an on and off state.

In a second aspect of the disclosure, the TSV test circuit means includes a voltage source means to apply a known voltage to a first end of the TSV while the second end of the TSV is held at a ground potential, a comparator circuit means for detecting the voltage level developed at the first end of the TSV in response to the applied voltage, a scan cell means for loading and shifting out a logic level indicative of the voltage level detected by the comparator circuit means and for controlling the voltage source means to one of an on and off state.

DESCRIPTION OF THE VIEWS OF THE DISCLOSURE

FIG. 1 illustrates a die with a test stimulus and response means connected to a first end of a TSV within the die according to the disclosure.

FIG. 4 illustrates a die including multiple test stimulus and response means, each coupled a first end of a TSV in the die according to the disclosure.

DETAILED DESCRIPTION OF THE DISCLOSURE

Figure 2:
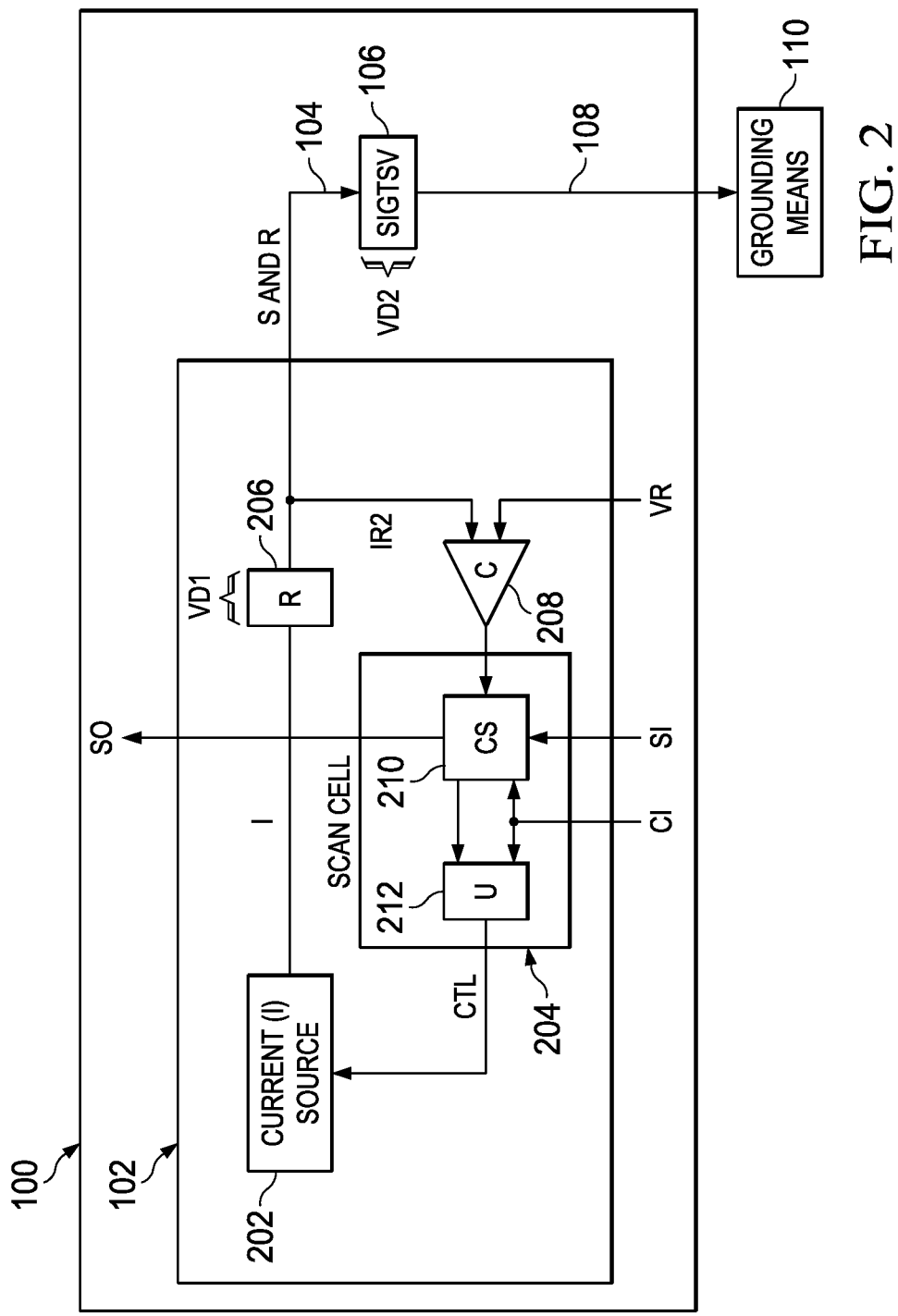
FIG. 2 illustrates a more detailed example of the stimulus and response means of FIG. 1 based on a current source for providing the stimulus to the first end of the TSV according to the disclosure.

FIG. 1 illustrates a die 100 containing an example embodiment of the disclosure. A test circuit 102, referred to a Test Stimulus & Response Means, is provided for stimulating a first end 104 of a Signal TSV (SIGTSV) 106 with a Stimulus and Response (S&R) signal while a second externally accessible end 108 of the TSV is held at ground potential by an external grounding means 110. The S&R signal is controlled and observed by scan circuitry within the test circuit. Communication with the scan circuitry is accomplished with a scan input (SI), scan output (SO) and control inputs (CI). A variable reference (VR) signal is also input to the test circuitry for allowing variable thresholds to be used in digitizing the response component on the S&R signal.

FIG. 2 illustrates a first example implementation of the test circuit 102 of FIG. 1 which uses a known current source 202 to provide the stimulus component of the S&R signal to a SIGTSV 106. A resistor (R) 206 is placed in the S&R signal path from the current source 202 to the TSV. A capture shift (CS) FF 210 and an update (U) FF 212, form the scan circuitry within the test circuit 102. The CS FF 210 operates, in response to the CI inputs, to capture and shift out the digitized output of a comparator (C) 208. The data shifted into the CS register is updated to the U FF 212 at the end of each capture and shift scan operation in response to the CI inputs. Thus the U FF only updates its state at the end of each scan operation. The control (CTL) output of the U FF controls the current source to be in one of an "on" or "off" state. When CTL is "on", the current source supplies a current to the TSV 106 on the S&R signal path. When CTL is "off", the current source does not supply a current to the TSV 106 on the S&R signal path. When "on", the current source drives a current through R 206, TSV 106 and to the grounding means 110. The voltage drop (VD2) developed across TSV 106 is input to a "high impedance" input of comparator 208 to be digitized, against the VR input to the comparator. The VR input is referenced to ground and is set to digitize against a voltage expected to be developed across a "good" TSV in response to the known current passing through the TSV from current source 202. The digitized output of the comparator 208 is captured and shifted out of the IC 100 via scan cell 204 to be evaluated by a tester to determine whether the TSV test passed or failed. If the test fails or if it is desired to do more exacting resistance testing of the TSV, further VR settings and capture and shift scan operations may be performed to obtain multiple digitization's of the voltage drop across the TSV to actually obtain a measurement the resistance of the TSV.

Figure 3:
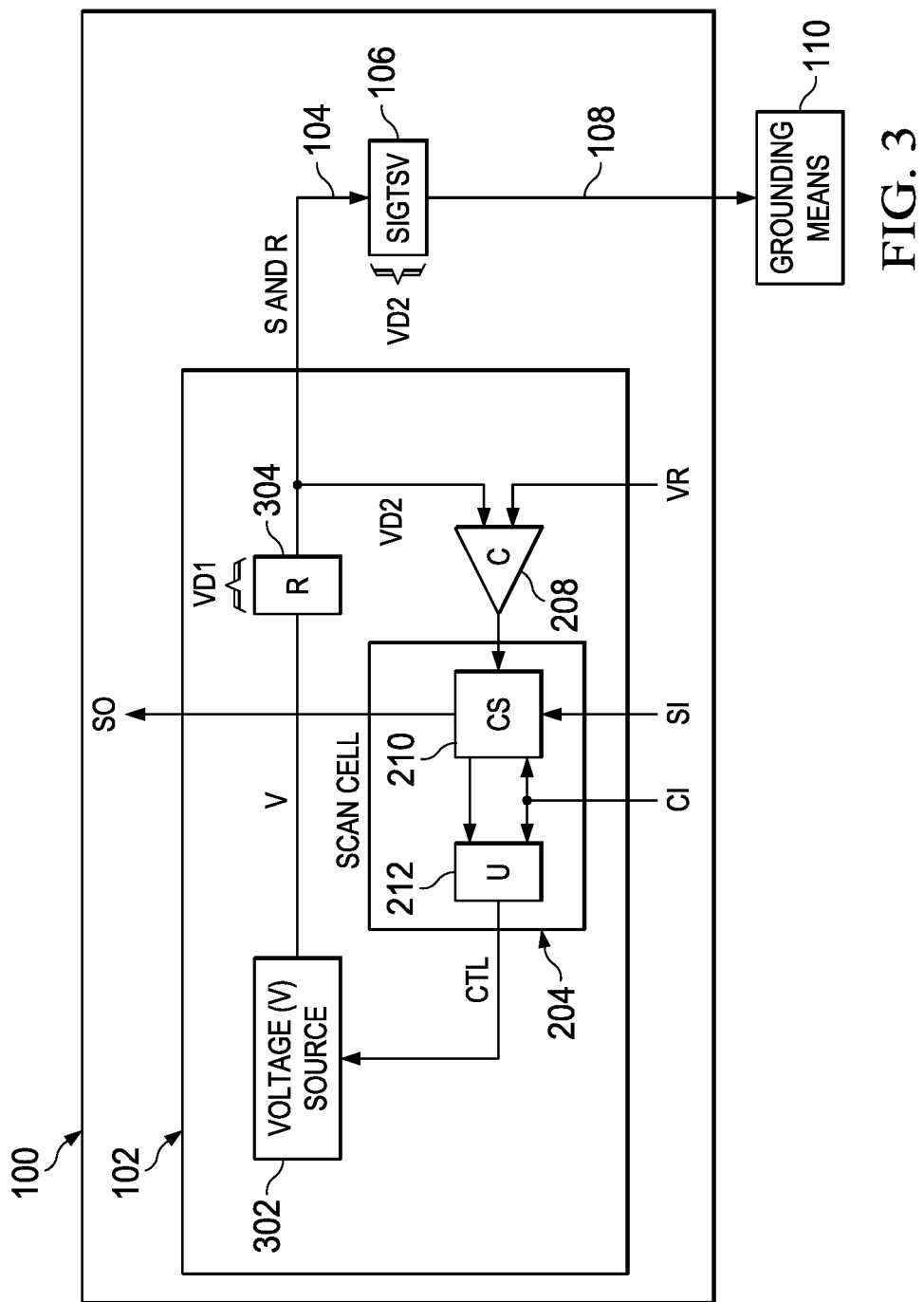
FIG. 3 illustrates a more detailed example of the stimulus and response means of FIG. 1 based on a voltage source for providing the stimulus to the first end of the TSV according to the disclosure.

FIG. 3 illustrates a second example implementation of the test circuit 102 of FIG. 1 which uses a known voltage source 302 to provide the stimulus component of the S&R signal to a SIGTSV 106. A known resistor (R) 306 is placed in the S&R signal path from the voltage source 302 to the TSV. A capture shift (CS) FF 210 and an update (U) FF 212, form the scan circuitry within the test circuit 102. The CS FF 210 operates, in response to the CI inputs, to capture and shift out the digitized output of comparator (C) 208. The data shifted into the CS register is updated to the U FF 212 at the end of each capture and shift scan operation in response to the CI inputs. Thus the U FF only updates its state at the end of each scan operation. The control (CTL) output of the U FF controls the voltage source to be in one of an "on" or "off" state. When CTL is "on", the voltage source applies a voltage to the TSV 106 on the S&R signal path. When CTL is "off", the voltage source does not apply a voltage to the TSV 106 on the S&R signal path. When "on", the applied voltage is dropped across R 304 and TSV 06, with respect to ground. The voltage drop (VD2) across TSV 106 is input to a "high impedance" input of comparator 208 to be digitized, against the VR input to the comparator. The VR input is referenced to ground and is set to digitize against a voltage expected to be dropped across a "good" TSV in response to the known applied voltage and the known resistance of R 304. The digitized output of the comparator 208 is captured and shifted out of the IC 100 via scan cell 204 to be evaluated by a tester to determine whether the TSV test passed or failed. If the test fails or if it is desired to do more exacting resistance testing of the TSV, further VR settings and capture and shift scan operations may be performed to obtain multiple digitization's of the voltage drop across the TSV to actually obtain a measurement the resistance of the TSV.

FIG. 4 illustrates a die 400 containing N TSVs 106 to be tested. Each TSV 106 is connected at its first end 104 to an S&R signal path of an associated test circuit 102. The test circuits 102 are serially connected via their SI and SO terminals to form a serial test circuit path from a SI input of the die to a SO output of the die. The CI input terminals of the test circuits are connected together and to CI inputs of the die. The VR input terminals of the test circuits are connected together and to a VR input of the die. The SI input, SO output, CI inputs and VR input of the die are connected to a tester. The externally accessible second ends 108 of the TSVs 106 are connected to grounding means 110. During the test, the tester will set the VR input to a desired digitizing threshold, scan the test circuits 102 from SI to SO to set the CTL output of the scan cell 204 of each test circuit 102 to the "on" state, as described in FIGS. 2 and 3. When CTL is set to the "on" state, the S&R signal path of each test circuit is enabled to stimulate the first end 104 of the TSVS 106 with a current, as described in FIG. 2 or a voltage as described in FIG. 3. The tester then performs a capture and shift scan operation to capture the digitized response from the comparators 208 of test circuits 102 and shift the captured digitized response out to the tester to determine whether the response from each TSV passes or fails the test. If all TSV resistances are designed to be relatively close in value, all N TSVs may be tested using only one VR setting from the tester and one capture and shift scan operation from the tester. However, if the TSVs are not designed to be close in resistance values, the process of setting a VR threshold and performing a capture and shift scan operation may have to be repeated multiple times to test different groups of TSVs that have been designed with different resistance values.

Figure 5:
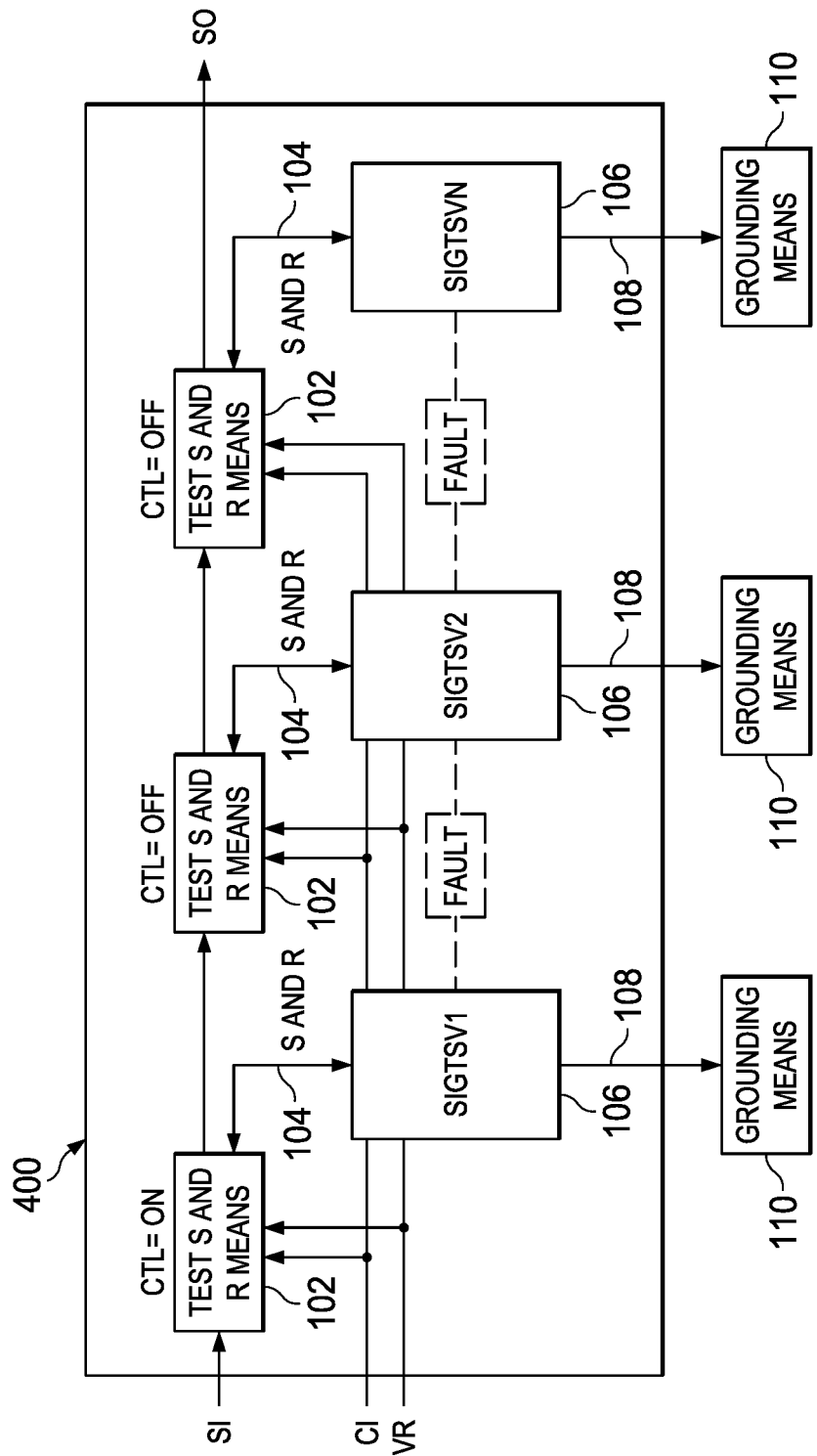
FIG. 5 illustrates a first stimulus and response means being enabled to stimulate a first end of its associated TSV, while other stimulus and response means are disable from stimulating the first end of their associated TSV according to the disclosure.
Figure 6:
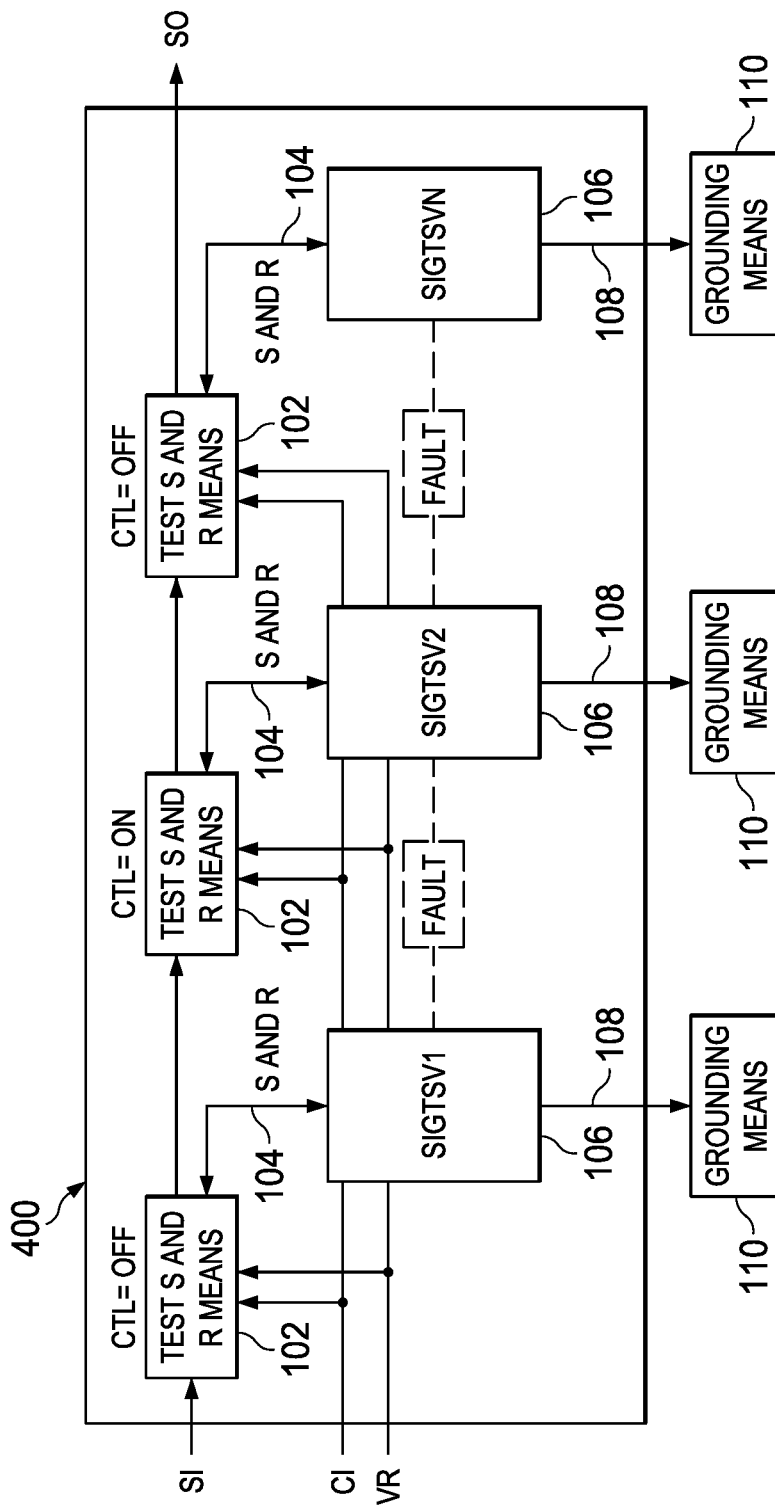
FIG. 6 illustrates a second stimulus and response means being enabled to stimulate a first end of its associated TSV, while other stimulus and response means are disable from stimulating the first end of their associated TSV according to the disclosure.
Figure 7:
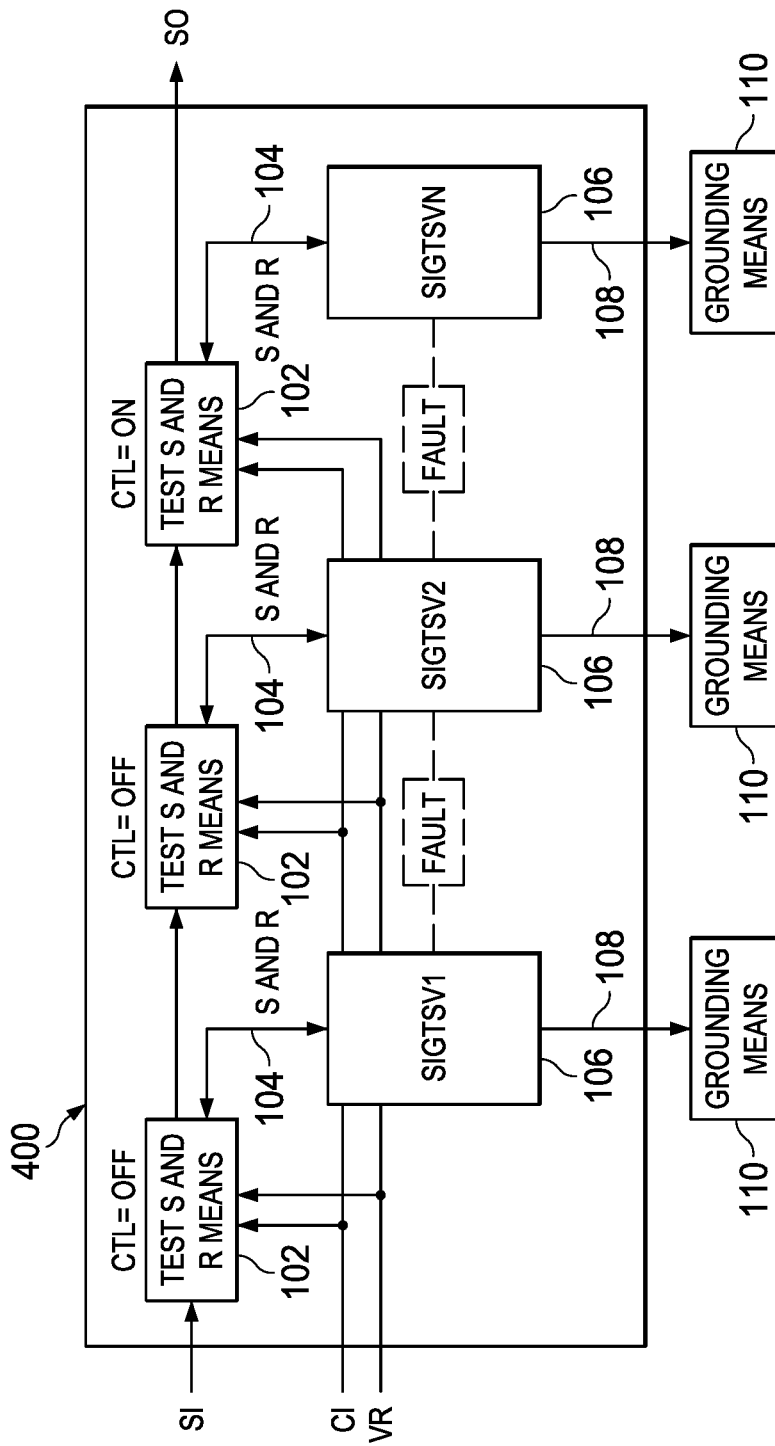
FIG. 7 illustrates a further stimulus and response means being enabled to stimulate a first end of its associated TSV, while other stimulus and response means are disable from stimulating the first end of their associated TSV according to the disclosure.

FIGS. 5-7 illustrate how the test circuits 102 may be used to test for faults (shorts) between the SIGTSVs 106 in die 400 of FIG. 4. In FIG. 5, the first test circuit 102 is set (CTL="on") by a scan operation to stimulates its TSV 106, while the other test circuits are not set (CTL="off") to stimulate their TSVs 106.

If there is not a short fault between the TSV being stimulated and the other TSVs that are not being stimulated, the other TSVs will be held at ground potential by their grounding means. With no shorted TSVs, a capture and shift scan operation with the VR set to some digitizing threshold above ground potential will result in a response test pattern being shifted out of the test circuits 102 with logic zeros from the non-stimulated TSVs and a logic one from the stimulated TSV.

If there is a fault between the TSV being stimulated and one or more of the other TSVs, the one or more other TSVs will not be at ground potential, but rather some voltage above ground potential, due to the short. With one or more shorted TSVs, a capture and shift scan operation with the VR set to some digitizing threshold above ground potential will result in a response test pattern being shifted out of the test circuits 102 with logic zeros from the non-stimulated and non-shorted TSVs and logic ones from the stimulated TSV and the one or more TSVs it is shorted too.

In FIG. 6, the second TSV is stimulated by its test circuit while the other TSVs are not being stimulated by their test circuit. As described in FIG. 5, if there are no shorts between the stimulated TSV and non-stimulated TSVs, the response captured and shifted out of the test circuits will be a logic one for the stimulated TSV and logic zeros for the non-stimulated TSVs. If there is a short between the stimulated TSV and one or more other TSVs, the response captured and shifted out of the test circuits will be a logic one for the stimulated and one or more other TSVs it is shorted to and logic zeros for the non-stimulated and non-shorted TSVs.

Figure 8:
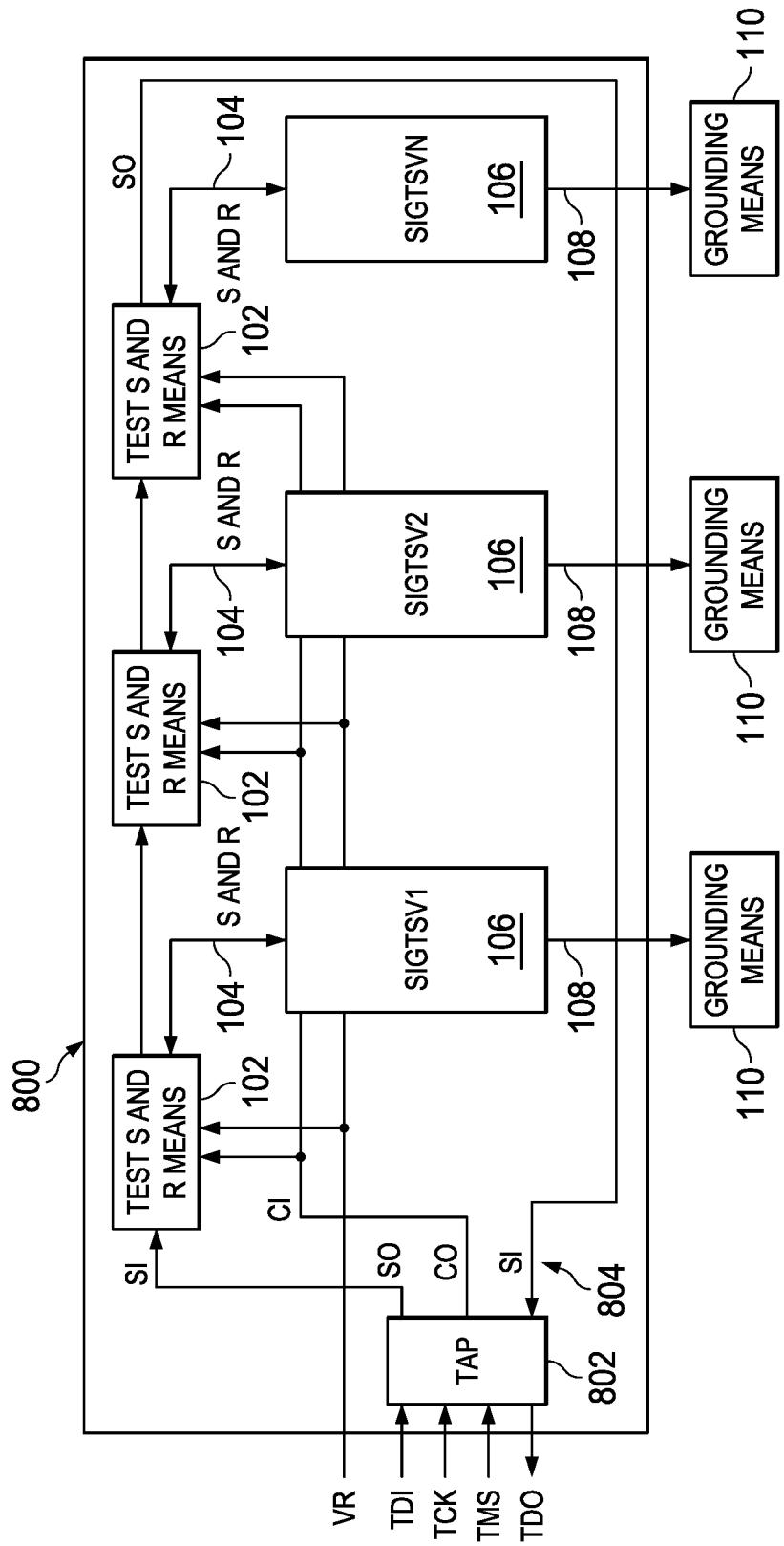
FIG. 8 illustrates a die including multiple test stimulus and response means and an IEEE 1149.1 TAP for accessing them, each stimulus and response means being coupled a first end of a TSV in the die according to the disclosure.

In FIG. 7, the Nth TSV is stimulated by its test circuit while the other TSVs are not being stimulated by their test circuit. As described in FIG. 5, if there are no shorts between the stimulated TSV and non-stimulated TSVs, the response captured and shifted out of the test circuits will be a logic one for the stimulated TSV and logic zeros for the non-stimulated TSVs. If there is a short between the stimulated TSV and one or more other TSVs, the response captured and shifted out of the test circuits will be a logic one for the stimulated and one or more other TSVs it is shorted to and logic zeros for the non-stimulated and non-shorted TSVs FIG. 8 illustrates a die 800 that is very similar to die 400 of FIG. 4. The difference between the two die is that die 800 contains the well known IEEE 1149.1 Test Access Port (TAP) having external TDI, TCK and TMS inputs and an external TDO output. These signals are connected to a tester during test operations. The TAP provides an internal scan output (SO) that is connected to the internal SI input of the test circuit scan path, internal control outputs (CO) that are connected to the internal CI inputs of the test circuit scan path and an internal scan input (SI) input that is connected to the SO output of the test circuit scan path. In response to the external TDI, TCK, TMS and TDO signals connected to the tester, the TAP controls and operates the test circuits as previously described in the TSV test operations described in FIGS. 4-7. As with FIG. 4, the VR signal remains an external input to die 800 so its threshold level can be controlled from the tester during test operations.

The SO, CO and SI test circuit scan path interface 804 of the TAP is enabled by an instruction scanned into the TAP's instruction register during a TAP instruction scan operation. Once interface 804 is enabled, a TAP data register scan operation is performed to shift data from TDI to SO of interface 804, through the test circuit scan path from SI to SO and from SI of interface 804 to TDO. During the data scan operations the TAP provides the CI signals to operate the test circuits 102 to perform capture, shift and update operations via the CO of interface 804. Since most die already include the TAP for boundary scan testing and other test and debug operations, it is a very simple process to augment the TAP to include a test circuit scan path access instruction and add the SI, CO, and SO interface 804 to the TAP.

Figure 9:
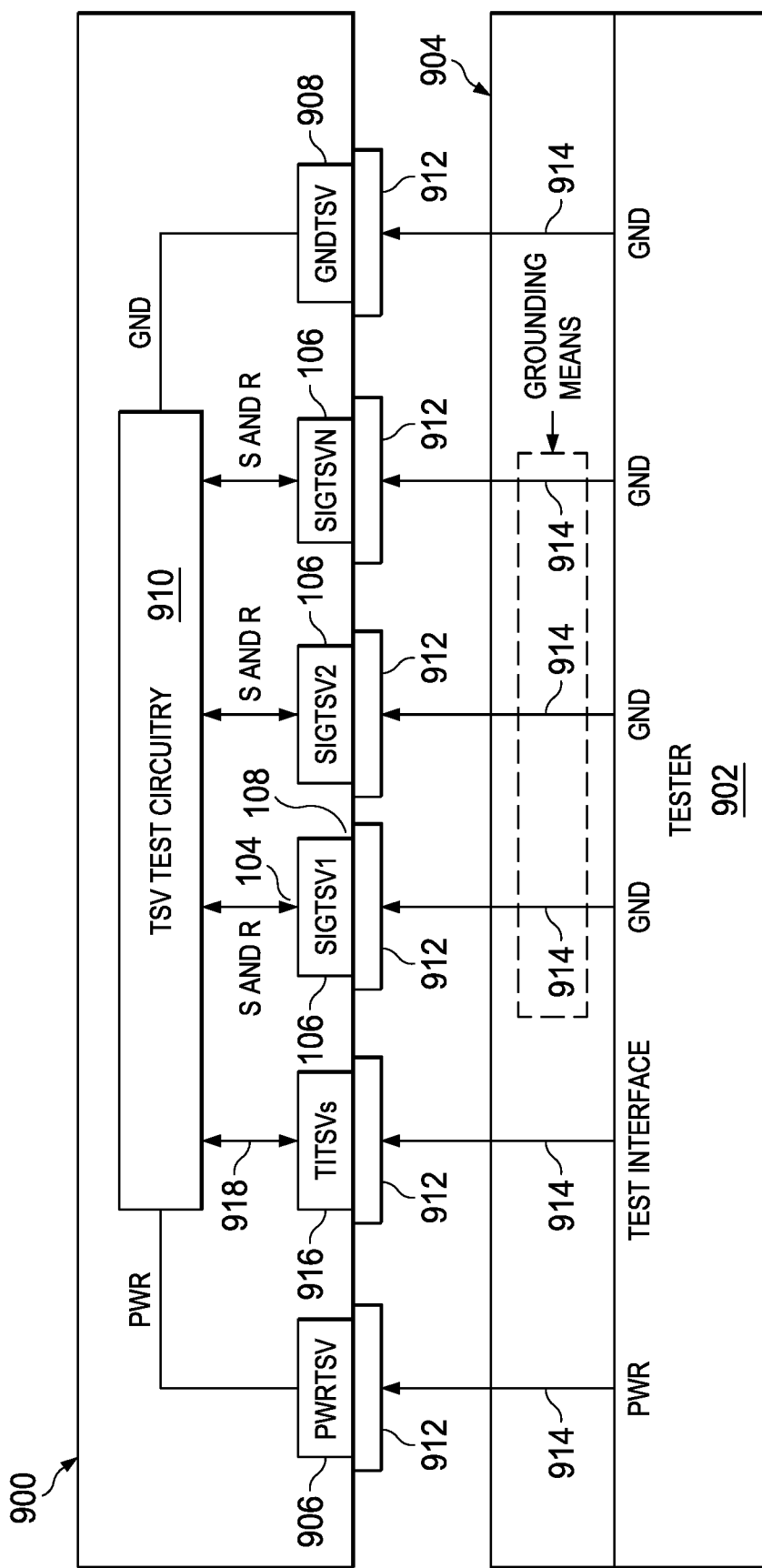
FIG. 9 illustrates a die with a power TSV, test interface TSV, multiple functional signal TSVs and a ground TSV coupled to a tester via probe needles according to the disclosure.

FIG. 9 illustrates a die 900 containing signal TSVs 106, a power TSV 906, a ground TSV 908, test interface TSVs 916 and TSV test circuitry 910 including a test circuit 102 for each signal TSV 106. Contact points 912 are provided on the die to allow probe needles or other probing means 914 from a probe fixture 904 to contact the power TSV 906, signal TSVs 106, test interface TSVs 916 and ground TSV 908. The probe fixture is coupled to a tester 902 to provide power to the power TSV 906, grounding means for the signal TSVs 106, test interface signals 918 for the test TSVs 916 and ground for the ground TSV 908. The test interface signals 918 include the scan interface and VR signals to the test circuits 102 of TSV test circuitry 910. The scan interface signals 918 may either be the SI, CI and SO signals of FIG. 4 or the TAP's TDI, TCK, TMS and TDO signals of FIG. 8. While only one test interface TSV 916 is shown, there will be one test interface TSV 916 for each test interface signal 918. During test, the tester energizes TSV test circuitry 910 and accesses the test circuits 102 via test interface signals 918 to stimulate and measure the response from the first end 104 of the signal TSVs 106 while the second end 108 of the signal TSVs are held at ground potential.

Figure 10:
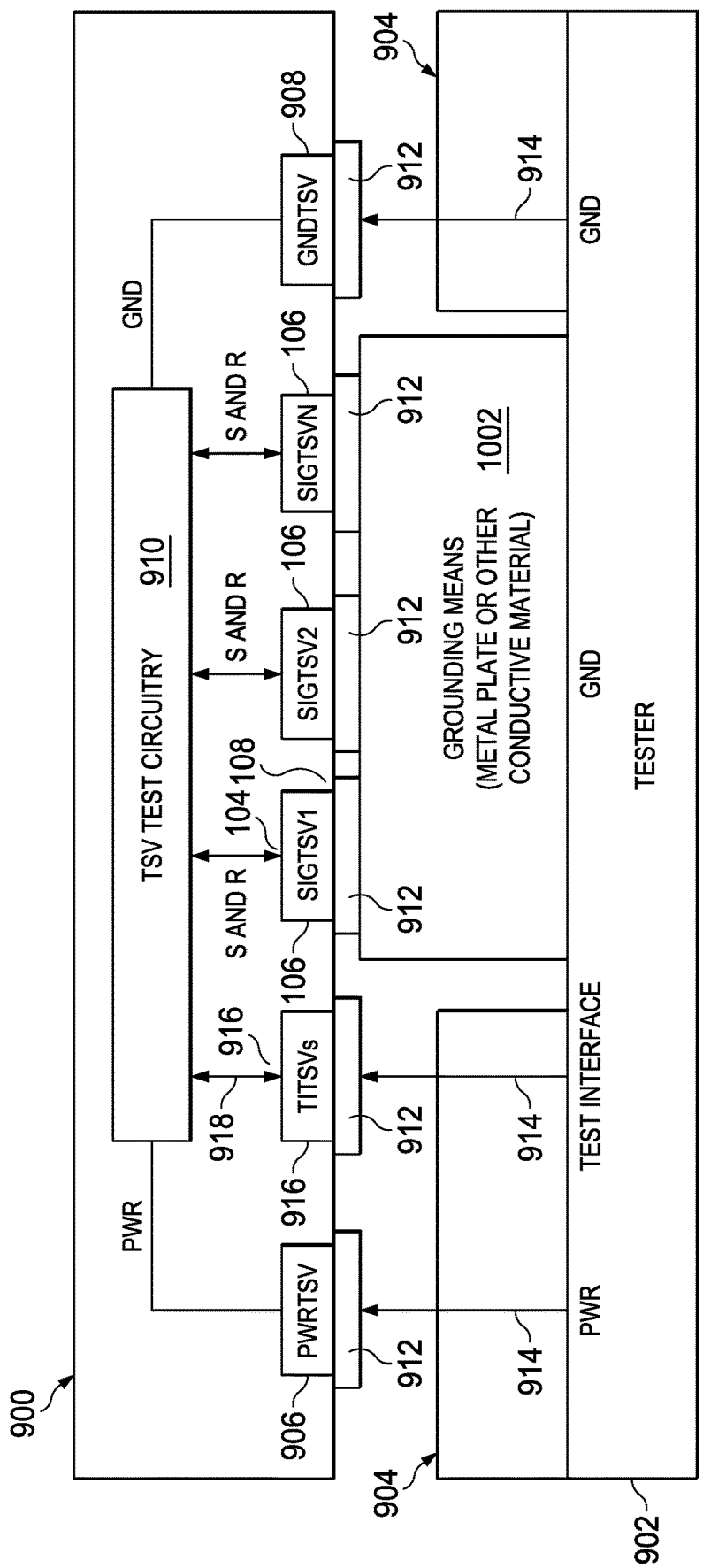
FIG. 10 illustrates a die with a power TSV, test interface TSV, multiple functional signal TSVs and a ground TSV coupled to a tester via probe needles and a grounding means according to the disclosure.

FIG. 10 illustrates the die 900, probe fixture 904 and tester 902 of FIG. 9. In this example, probe needles provide power and ground to energize the test circuitry 910 and to provide the test interface signals 918 to the test circuitry 910 as described in FIG. 9. However, the grounding means to the contact points 912 of the signal TSVs 106 is provided by a metal plate or other conductive material 1002 coupled to and placed at ground potential by tester 902. This method of providing a grounding means may be necessary when the pitch of the external contact points 912 of the signal TSVs 102 is too small to be probed by individual probe needles 914.

Figure 11:
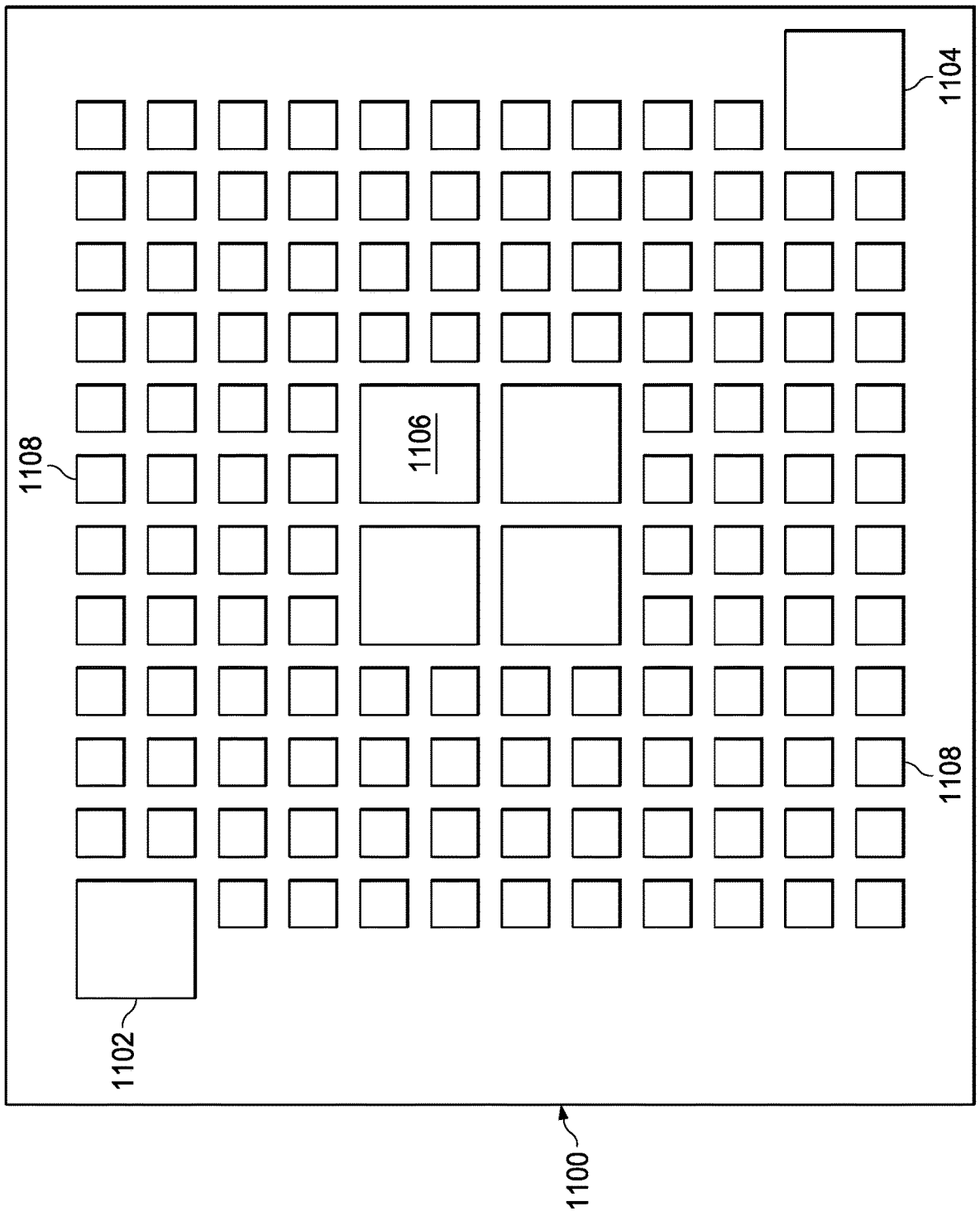
FIG. 11 illustrates contact points on a surface of a die for power, test interface, functional and ground contact points according to the disclosure.

FIG. 11 illustrates a surface of a die 1100 with a power TSV contact point 1102, a ground TSV contact point 1104, scan interface and VR contact points 1106 and many signal TSV contact points 1108. The power, ground, scan interface and VR contact points are designed large and with enough pitch to be easily probed by probe needles. The signal TSV contact points are designed small and with small pitch so that many functional signals may be connected to the die surface. The signal TSV contact points cannot be probed by conventional probe needles.

Figure 12:
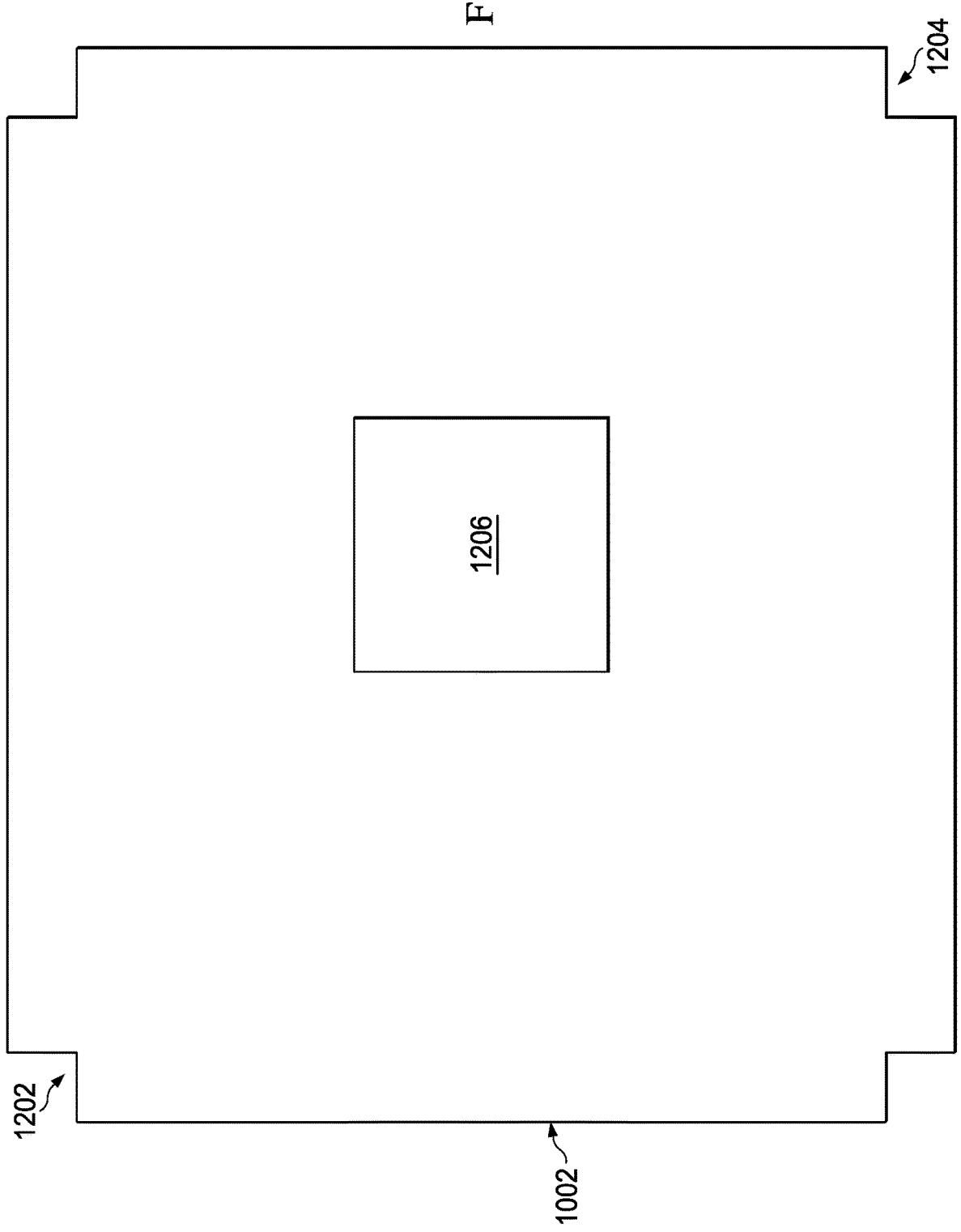
FIG. 12 illustrates a grounding means for making contact to all the functional signal contact points on the surface of the die of FIG. 11.

FIG. 12 illustrates an example grounding means 1002 as described in FIG. 10. The artwork of the grounding means 1002 is designed for the layout of the surface contact points of die 1100. The grounding means 1002 has an opening 1202 to allow probe access by the tester 902 to the power TSV contact point 1102, an opening 1204 to allow probe access by the tester 902 of the ground TSV contact point 1104, an opening 1206 to allow probe access by the tester 902 of the scan interface and VR contact points 1106. Other than the openings, the grounding means provides a conductive surface for making contact to all the signal TSV contact points 1108 of Die 1100, so that, under tester control, all the signal TSV contact points 1108 may be placed at a ground potential for testing, according to the disclosure.

Figure 13:
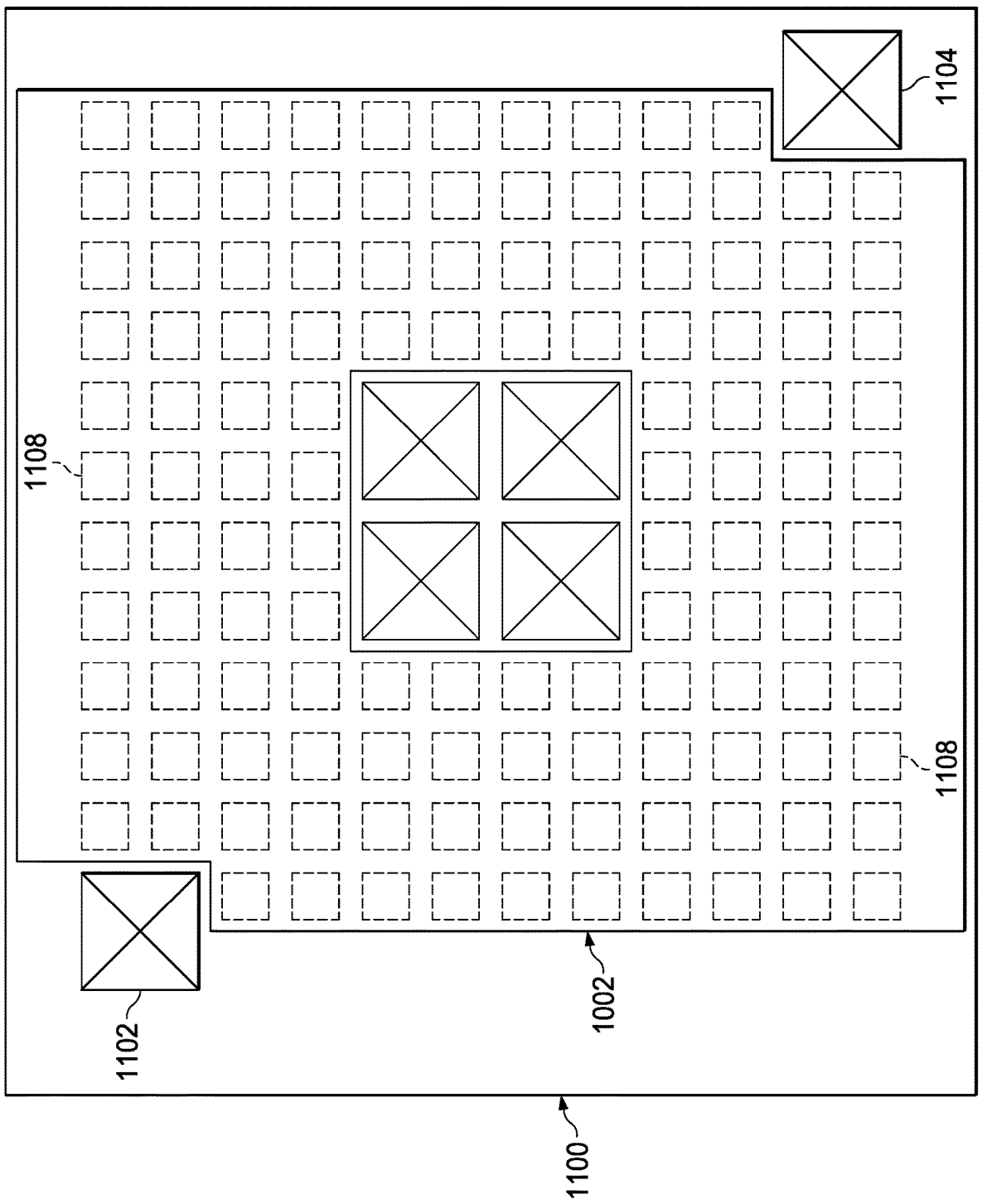
FIG. 13 illustrates the placement of contact of the ground means of FIG. 12 to the surface of the die of FIG. 11 according to the disclosure.

FIG. 13 illustrates the grounding means 1002 of FIG. 12 making contact to the signal TSV contact points 1108 on the surface of die 1100. When contact is made between the die and grounding means, the tester can take all signal TSV contact points 1108 to ground potential, apply power to power TSV contact point 1102 via a probe needle 914 passing through opening 1202 (indicated by an X), apply ground to ground TSV contact point 1104 via a probe needle 914 passing through opening 1204 and access the scan interface and VR contact points 1106 to test circuitry 910 via probe needles 914 passing through opening 1206.

Figure 14:
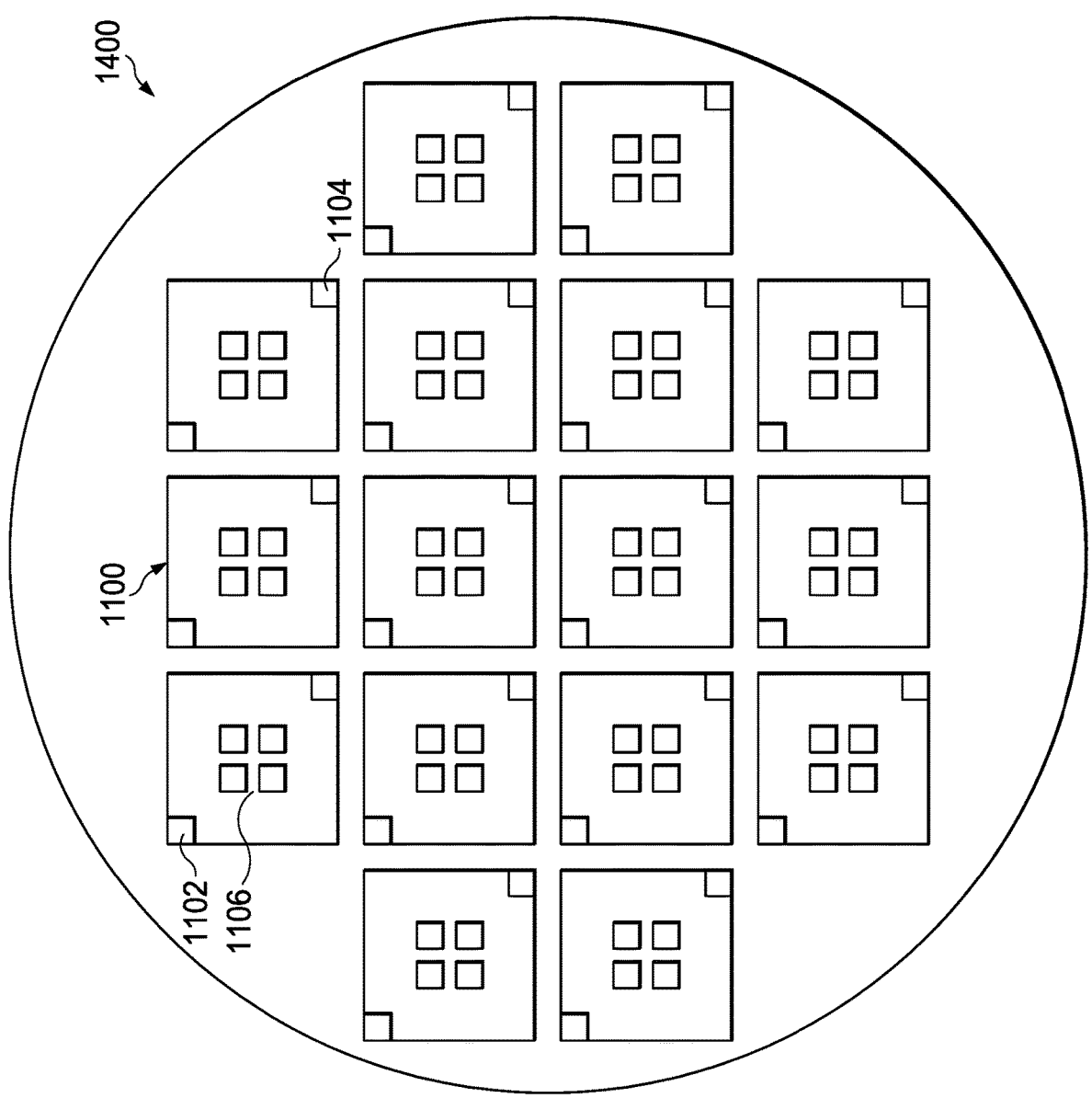
FIG. 14 illustrates a wafer with die, each die having power, test interface, functional and ground contact points according to the disclosure.

FIG. 14 illustrates a circular wafer 1400 of die 1100 of FIG. 11. Each die 1100 has a power contact point 1102, test interface contact points 1106, ground contact point 1104 and, while not shown, signal TSV contact points 1108.

Figure 15:
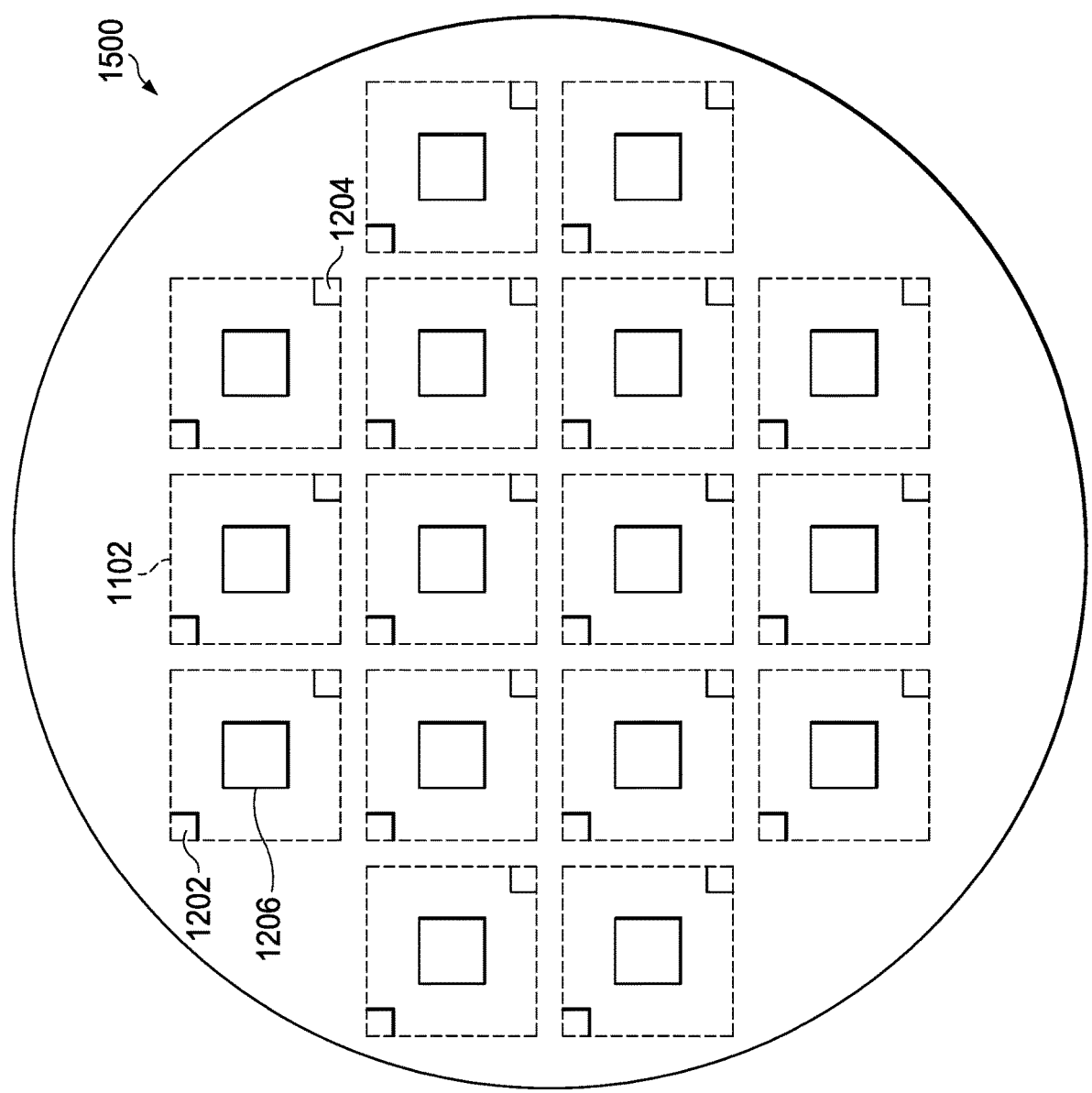
FIG. 15 illustrates a grounding means for making contact to all the functional signal contact points of each die of FIG. 13 according to the disclosure.

FIG. 15 illustrates a circular grounding means 1500 of conductive material with a diameter matching that of the circular wafer. The art work of the grounding means 1500 has been designed with an opening 1202 for providing probe access from a tester 902 to power contact point 1102 of each die 1100, an opening 1204 for providing probe access from the tester to ground contact point 1104 of each die 1100 and an opening 1206 for providing probe access from the tester to test interface 1106 of each die 1100. The body of the grounding means 1500 provides electrical contact to all signal TSV contact points 1108 of each die 1100.

When alignment and contact is made between the wafer 1400 and grounding means 1500, the tester can take all signal TSV contact points 1108 of each die 1100 to ground potential, apply power to power TSV contact point 1102 of each or a selected group of die 1100 via a probe needle 914 passing through openings 1202, apply ground to ground TSV contact point 1104 of each or a selected group of die 1100 via a probe needle 914 passing through openings 1204 and access the test interface contact points 1106 of each or a selected group of die 1100 via probe needles 914 passing through openings 1206.

It should be understood that while the examples of FIGS. 11-15 show a particular power, ground, test interface and signal contact point layout on the surface of die 1100 and a grounding means 1002 or 1500 art work designed to accommodate that particular contact point layout, the disclosure is not limited in any way to only this example contact point layout and grounding means artwork. Indeed, the disclosure broadly covers any kind of die surface contact point layout and accompanying grounding means artwork required for providing a grounding means contact for signal TSVs while allowing openings for making probe contact to power, ground and test interface contacts points of the die. In addition to the openings required for probing power, ground and test interface contact points, the ground means 1002 or 1500 may have additional openings as well for accessing other contact points on the die or for other purposes. As mentioned in regard to FIG. 10, grounding means 1002 or 1500 can be made any type of conductive material, such as but not limited to copper material and conductive elastomer material.

Figure 16:
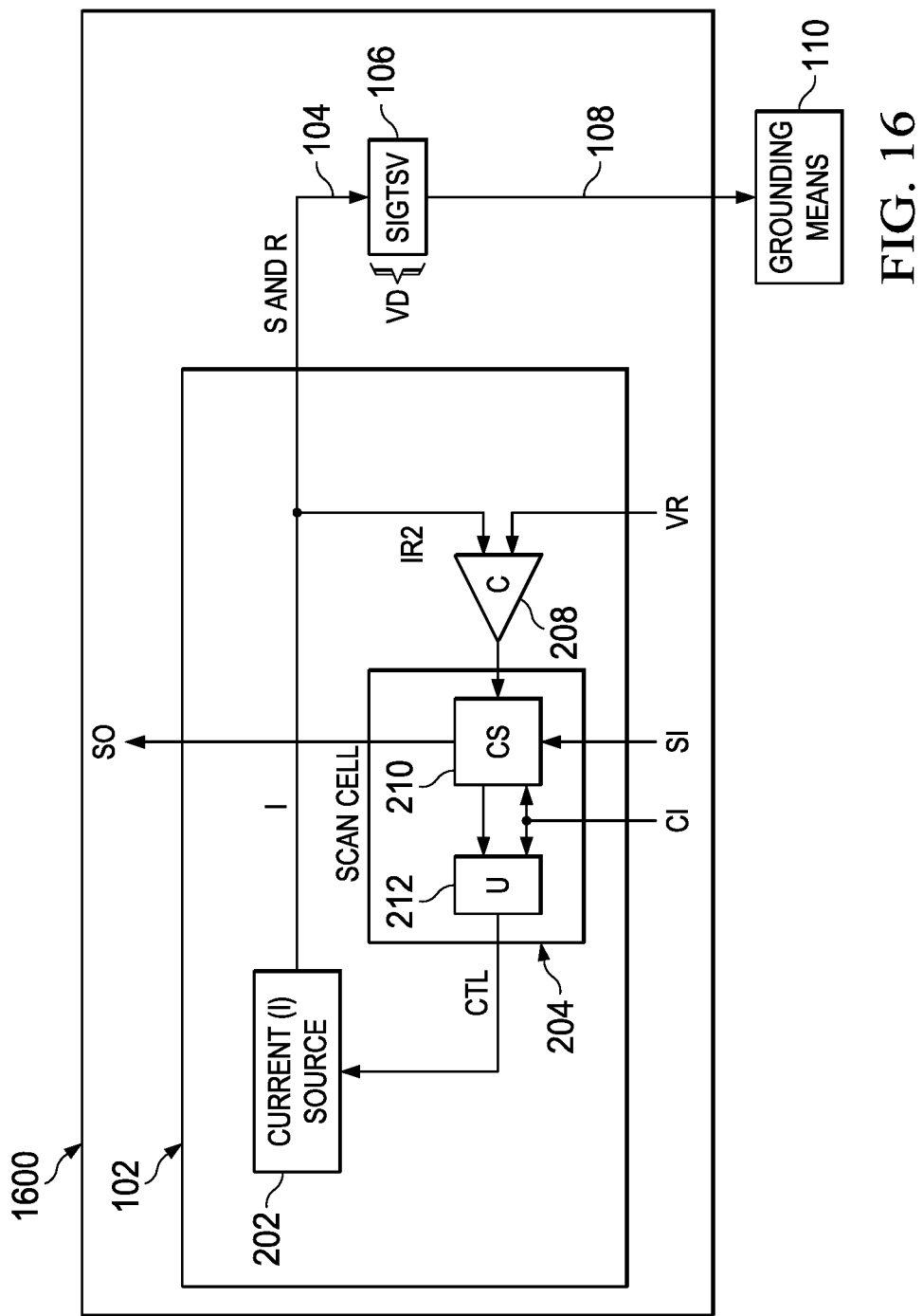
FIG. 16 illustrates an alternate embodiment of the stimulus and response means of FIG. 2.

FIG. 16 illustrates a die 1600 that includes an alternate embodiment of test circuit 102 of FIG. 2. The test circuit 102 of FIG. 16 is identical in structure and operation as test circuit 102 of FIG. 2, with the exception that resistor 206 has been removed from the S&R path between the current source 202 and the first end 104 of the TSV 106. When the current source is enabled by the CTL output of scan cell 204 it provides the stimulus current directly to the first end 104 of the TSV 106. The voltage drop (VD) developed across TSV is digitized by comparator 208 and capture and shift out of the scan cell 204, as described in FIG. 2. The alternate test cell 102 of FIG. 14 may be substituted for test cell 102 of FIG. 2 in all embodiments illustrated in this disclosure.

What is claimed is:

1. A method comprising:
receiving, by a first Through Silicon Via (TSV) in a device, a ground signal at a first externally accessible end of the first TSV;
receiving, by a second TSV in the device, the ground signal at a second externally accessible end of the second TSV;
receiving, by a third TSV in the device, the ground signal at a third externally accessible end of the third TSV;
setting, a first test circuit in the device, to an on state;
transmitting, by the first test circuit in the device, a test signal to a first internally accessible end of the first TSV;
detecting, by the first test circuit, a test signal response at the first internally accessible end of the first TSV;
digitizing, by the first test circuit, the test signal response to form a digitized test signal response; and
outputting, by the first test circuit, the digitized test signal response.

2. The method of claim 1, wherein:
a second test circuit in the device is set to an off state;
the second test circuit is coupled to a second internally accessible end of the second TSV;
a third test circuit in the device is set to an off state; and
the third test circuit is coupled to a third internally accessible end of the third TSV.

3. The method of claim 1, wherein:
the test signal is a voltage.

4. The method of claim 1, wherein:
the test signal is a current.

5. The method of claim 1, further comprising:
determining a test result based on a comparison of the digitized test signal response to a voltage threshold.

6. The method of claim 5, wherein:
the test result is a passing result in response to the digitized test signal response being at or above the voltage threshold.

7. The method of claim 5, wherein:
the test result is a failing result in response to the digitized test signal response being lower than the voltage threshold.

8. The method of claim 7, wherein:
the first test circuit includes a comparator;
the comparator including a first input and a second input;
the first input is coupled to the first internally accessible end of the first TSV; and
the second input is coupled to a variable reference voltage threshold.

9. The method of claim 8, wherein:
the test signal response is digitized based on a first value of the variable reference voltage threshold.

10. The method of claim 9, wherein:
in response to the failing result, the variable reference voltage threshold is set to a second value.

11. A system comprising:
a device including:
a first Through Silicon Via (TSV) configurable to receive a ground signal at a first externally accessible end of the first TSV;

a second TSV configurable to receive the ground signal at a second externally accessible end of the second TSV; and a third TSV configurable to receive the ground signal at a third externally accessible end of the third TSV;

a first test circuit in the device set to an on state, where the first test circuit is configurable to:

transmit a test signal to a first internally accessible end of the first TSV; and detect a test signal response at the first internally accessible end of the first TSV;

digitize the test signal response to form a digitized test signal response; and output the digitized test signal response; and a test interface configurable to:

provide the ground signal to at least one of the first TSV, the second TSV and the third TSV;

initiate testing by the first test circuit; and receive the digitized test signal response.

12. The system of claim 11, wherein:

a second test circuit in the device is set to an off state;

the second test circuit is coupled to a second internally accessible end of the second TSV;

a third test circuit in the device is set to an off state; and the third test circuit is coupled to a third internally accessible end of the third TSV.

13. The system of claim 11, wherein:

the test signal is a voltage.

14. The system of claim 11, wherein:

the test signal is a current.

15. The system of claim 11, wherein:

a test result is determined by comparing the digitized test signal response to a voltage threshold.

16. The system of claim 15, wherein:

the test result is a passing result in response to the digitized test signal response being at or above the voltage threshold.

17. The system of claim 15, wherein:

the test result is a failing result in response to the digitized test signal response being lower than the voltage threshold.

18. The system of claim 17, wherein:

the first test circuit includes a comparator;

the comparator including a first input and a second input;

the first input is coupled to the first internally accessible end of the first TSV; and the second input is coupled to a variable reference voltage threshold.

19. The system of claim 18, wherein:

the test signal response is digitized based on a first value of the variable reference voltage threshold.

20. The system of claim 19, wherein:

in response to the failing result, the test interface is configurable to receive a second value of the variable reference voltage threshold.

* * * * *